United States Patent [19]

Böhm

[11] Patent Number: 4,473,204
[45] Date of Patent: Sep. 25, 1984

[54] METHOD OF MOUNTING A PLATE ON A BASE AND MOUNTING PLUG THEREFOR

[75] Inventor: Lothar Böhm, Springe, Fed. Rep. of Germany

[73] Assignee: Licentia Patent-Verwaltungs-GmbH, Frankfurt am Main, Fed. Rep. of Germany

[21] Appl. No.: 230,274

[22] Filed: Jan. 30, 1981

[30] Foreign Application Priority Data

Jan. 30, 1980 [DE] Fed. Rep. of Germany ....... 3003176

[51] Int. Cl.³ .......................................... F16M 13/00
[52] U.S. Cl. ................................... 248/1; 174/138 D
[58] Field of Search .................. 174/138 D; 403/167; 211/41; 248/220.2, 222.4, 225.2, 239, 250, 309 A, 507, 508, 509, 680, 1

[56] References Cited

U.S. PATENT DOCUMENTS

| | | | |
|---|---|---|---|
| 2,379,752 | 7/1945 | Schultz | 248/235 X |
| 2,411,629 | 11/1946 | Lane | 248/235 X |
| 2,586,626 | 2/1952 | Dunn | 248/309.2 |
| 3,688,635 | 9/1972 | Fegen | 174/138 D |
| 3,777,052 | 12/1973 | Fegen | 174/138 D |

FOREIGN PATENT DOCUMENTS 2163062 7/1973 France.
2377110 8/1978 France.

Primary Examiner—William H. Schultz
Attorney, Agent, or Firm—Spencer & Frank

[57] ABSTRACT

A plate (such as a printed circuit board) is mounted and immobilized on a base (such as a chassis of a television receiver) by performing the following sequential steps: affixing mounting plugs on the base; positioning an apertured plate on the mounting plugs such that the head of each mounting plug projects through an opening of the plate and the plate rests on a support face of each plug; sliding the plate in its plane in a predetermined direction into a position in which an underside of each mounting plug head is situated immediately above a surface portion of the plate and edge portions defining the plate openings are in an abutting relationship with the respective mounting plugs; and bringing a component into an abutting relationship with a trailing edge of the plate subsequent to completion of the sliding step for preventing the plate from being shifted opposite the predetermined direction, whereby the plate is immobilized.

4 Claims, 3 Drawing Figures

METHOD OF MOUNTING A PLATE ON A BASE AND MOUNTING PLUG THEREFOR

BACKGROUND OF THE INVENTION

This invention relates to a method of securing a plate, such as a printed circuit board to a base, such as a chassis of an electronic equipment, particularly a television receiver. The printed circuit board is mounted for easy removal for servicing.

Frequently, the printed circuit boards are surrounded by an immobilizing metal frame. The frame itself is releasably mounted on supports of an equipment chassis so that the printed circuit board may be either entirely removed from its supports or may be flipped into a servicing position. The frame is usually a metal rail secured to metallic support points on the chassis. Such a securing of printed circuit boards is relatively expensive and circumstantial. The frame rails have to be separately manufactured and further, support elements are required which are mounted on the base or on the chassis of the receiver. It is a further disadvantage of such an arrangement that the securing elements have a very substantial weight.

In the alternative, the printed circuit board may be mounted by screws, with the interposition of spacers, to a housing portion of the television receiver. This, however, requires very time-consuming work steps in the manufacture of the television receiver. A securing of printed circuit boards by means of a clip or snap connection—which are further possibilities—is advantageously usable only in case of very small printed circuit boards, because larger boards need a great number of snap connections to ensure a sufficient number of support points. A great number of snap connections, however, cannot be loosened simultaneously without assistance so that when servicing is needed, difficulties in loosening and/or removing the printed circuit board may be encountered.

SUMMARY OF THE INVENTION

It is an object of the invention to provide an improved method of the above type, whereby even relatively large printed circuit boards are supported in a very satisfactory manner and may be readily loosened.

This object and others to become apparent as the specification progresses, are achieved by the invention, according to which, briefly stated, the plate-like member, such as a printed circuit board is positioned on support faces of mounting plugs which partially project through apertures in the printed circuit board and which are held in a base and thereafter the printed circuit board is shifted parallel to its plane and is subsequently blocked by a component attached, for example, to the base.

The mounting plugs for the printed circuit board are advantageously so designed that they provide simultaneously for a support, a predetermined spacing and a reliable immobilization of the printed circuit board. By virtue of the cooperation of the mounting plugs with the printed circuit board, the latter, after having been positioned on the mounting plugs, has two degrees of freedom of motion: it can be lifted off the mounting plugs or it can be shifted in one direction on the mounting plugs parallel to its plane. After such a shifting motion has been carried out, only one degree of freedom of motion remains, namely a backward shift, since, after the shift, an upward motion of the board is blocked by a head of each plug. The remaining freedom of motion is taken away by installing a rear wall plate on the chassis. In this manner the printed circuit board is blocked in its shifted position and is thus entirely immobilized. The arrangement of the mounting plugs may be selected arbitrarily according to the individual requirements. In the zone of heavy structural components supported by the printed circuit board, several mounting plugs may be provided, whereby structural components which heretofore required a separate securement, may be supported solely by the printed circuit board.

DESCRIPTION OF THE PREFERRED EMBODIMENT

Figure 1:
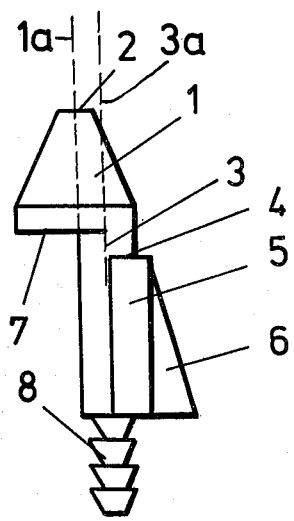
FIG. 1 is an elevational view of a mounting plug according to a preferred embodiment of the invention.

Turning now to FIG. 1, there is shown a mounting plug which may be a one-piece plastic component. The plug has a head 1 which tapers towards its top 2 and which has an underside 7. The mounting plug further has a stem 3 whose axis 3a is offset parallel with respect to the axis 1a of the head 1. On the stem 3 there is arranged a rectangular support 5 which has an engagement face 4, extending parallel to the underside 7. Along the middle of the support 5 there extends, in a direction parallel to the axes 1a and 3a, a buttress 6 which widens in a direction away from the head 1. From the lower end of the stem 3, remote from the head 1, there extends, in a direction parallel to axes 1a and 3a a foot (anchor) 8 adapted to be held by friction, as will be discussed below. The distance between the underside 7 of the head 1 and the upper face 4 of the rectangular support 5 generally corresponds to the thickness of the plate-like member (such as a printed circuit board) 13 to be held by the mounting plug.

Figure 2:
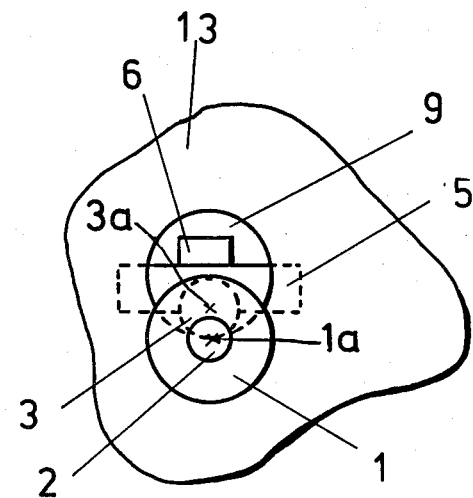
FIG. 2 is a top plan view of the preferred embodiment shown together with a printed circuit board.

Turning now to FIG. 2, the head 1 of the mounting plug projects through a circular opening 9 of the printed circuit board 13 such that the axis 1a of the mounting plug head 1 is offset with respect to the center of the opening 9. The underside of the printed circuit board 13 lies on the upper face 4 of the support 5. A movement of the board 13 in the upward direction is prevented by the underside 7 of the head 1, because, as will be discussed in more detail below, after insertion of the board 13 of the mounting plugs, the board is shifted so that the underside 7 extends over an upper surface portion of the board 13.

Figure 3:
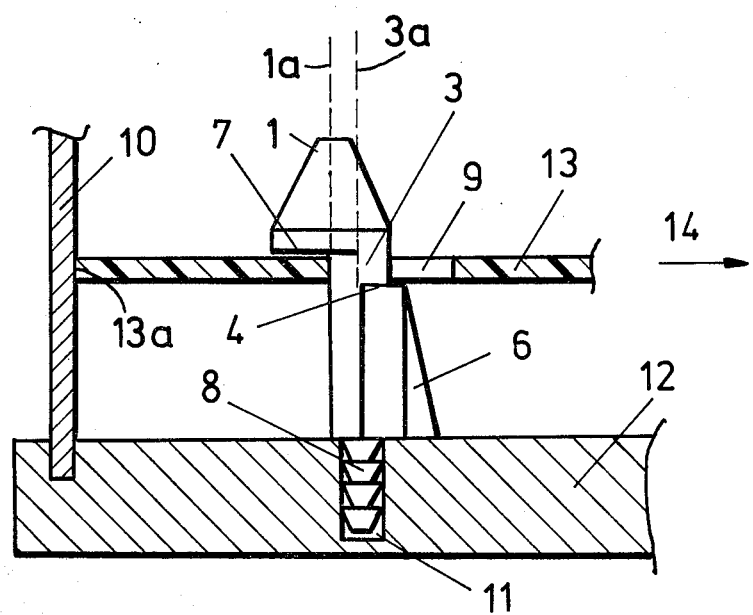
FIG. 3 is a partially sectional elevational view of an interlocked, immobilized assembly, including a mounting plug shown in FIGS. 1 and 2.

Turning now to FIG. 3, there is shown the cooperation and relationship between the mounting plug, a rear wall 10, a base (chassis) 12 and the printed circuit board 13 in the immobilized state of the latter. The anchor 8 of the mounting plug is frictionally held in a blind bore 11 of the base 12, so that the mounting plug is held upright, that is, its axes 1a and 3a are substantially perpendicular to the base 12. The underside of the support 5 and the buttress 6 engage the top face of the base 12 and thus stabilize the mounting plug against lateral loads. Dependent upon the size of the printed circuit board 13, an appropriate number of mounting plugs are arranged on the base plate 12. In the zone of heavy structural elements carried by the printed circuit board 13, preferably a greater number of mounting plugs are arranged than in the zones where only lighter structural elements are supported.

According to the intended arrangement of mounting plugs in the base plate 12, the printed circuit board 13 is pre-stamped in such a manner that all mounting plugs may simultaneously pass through the respective apertures 9 in the printed circuit board 13 as the latter is positioned onto the mounting plugs. The upward taper of each mounting plug head 1 enhances the alignment (centering) of the apertures 9 with the respective mounting plug heads 1. Each mounting plug is so oriented in the base plate 12 that the axial offset of the head 1 with respect to its stem 3 is oriented in the direction of the intended location of a rear wall plate 10 to be held vertically in the base plate 12.

After the printed circuit board 13 is positioned on the mounting plugs such that the underside of the printed circuit board 13 lies flat on the upper surface 4 of the respective rectangular support 5 of each mounting plug, the printed circuit board 13 is shifted in the direction 14 until the trailing edge portion of each opening 9 abuts against a front part of the respective stem 3. In such a position the heads 1 of the mounting plugs are eccentrically located relative to the respective openings 9 and, as a result, the underside 7 of each mounting plug is situated immediately above an upper surface portion of the printed circuit board 13. Thus, after the above-noted shift there remains only a single degree of freedom of displacement for the board 13, namely, a possible shift in the direction opposite to that indicated by the arrow 14. The upper stop for the printed circuit board 13 is constituted by the underside 7 of the head 1 while the lower stop is constituted by the upper face 4 of the support 5. It is noted that for the sake of clarity the surfaces 4 and 7 are shown spaced from the respective bottom and top sides of the printed circuit board 13; in practice a contacting relationship is intended. A lateral displacement of the circuit board 13 in its plane in a direction perpendicular to the arrow 14 is also no longer possible, due to the limiting effect of the circular course of the board edges defining each opening 9.

After shifting the printed circuit board 13 as described above, the rear wall plate 10 is mounted (for example, inserted) on the base 12 in such a manner that the rear wall plate 10 abuts a border edge 13a of the printed circuit board 13. The border edge 13a is a trailing edge during the above-described shifting of the board 13 in the direction of the arrow 14. In this manner the printed circuit board 13 is immobilized, that is, the last degree of freedom of motion is eliminated, since as long as the rear wall plate 14 is in place, the board 13 cannot be shifted in a direction opposite to arrow 14.

By virtue of the securing measure described above, no holding frame for the circuit board is needed; the method and the mounting plug according to the invention make possible a rapid and secure mounting of printed circuit boards and further ensure an easy removal thereof for servicing.

It will be understood that the above description of the present invention is susceptible to various modifications, changes and adaptations, and the same are intended to be comprehended within the meaning and range of equivalents of the appended claims.

What is claimed is:

1. A readily releasable interlocked assembly for supporting a plate on a base in an immobilized state and at a predetermined distance from said base; said plate having a bottom side oriented towards said base and an opposite top side and a border edge; comprising in combination
   (a) means defining a plurality of holes in said base;
   (b) means defining a plurality of openings in said plate;
   (c) a plurality of mounting plugs held in said base; each mounting plug comprising
      (1) a stem having a first end, a second end and a longitudinal axis substantially perpendicular to the base;
      a head carried at said first end of said stem; said head having a longitudinal axis extending parallel-spaced from the longitudinal axis of said stem; and an underside being substantially perpendicular to said axes; said head having dimensions that allow passage thereof through a respective said opening of said plate;
      (3) a support carried on said stem and having an engagement face situated between said underside of said head and said second end of said stem; said engagement face being parallel to said underside and spaced therefrom by a distance corresponding substantially to the thickness of the plate to be supported; said plate being positioned on said mounting plugs such that said bottom side of said plate is supported on the engagement face of each mounting plug and the head of each mounting plug projects through a respective said opening in said plate such that said underside of each said head is situated immediately above a portion of said top side of said plate and further the longitudinal axis of each head being oriented from the longitudinal axis of each respective stem in a direction toward said border edge of said plate;
      (4) an anchor carried at said second end of said stem and projecting from said stem in a direction substantially parallel to said axes, said anchor being received and frictionally held in a respective said hole of said base; and
   (d) a wall component readily removably supported and having a face abutting said border edge of said plate.

2. A readily releasable interlocked assembly as defined in claim 1, wherein said wall component is readily removably supported in said base.

3. A readily releasable interlocked assembly as defined in claim 1, wherein said openings in said plate are circular.

4. A readily releasable interlocked assembly as defined in claim 1, further comprising a buttress carried on each said stem; said buttress projecting from the respective stem in a direction opposite to the direction pointing from said longitudinal axis of said stem to the longitudinal axis of said head; said buttress having an underside adapted to engage an upper face of said base, whereby external forces applied to each said mounting plug in a direction oriented substantially from said longitudinal axis of said head to said longitudinal axis of said stem are taken up by said buttress.

* * * * *